(12) United States Patent
Blyth et al.

(10) Patent No.: US 6,985,372 B1
(45) Date of Patent: Jan. 10, 2006

(54) ANALOG CONTENT ADDRESSABLE MEMORY (CAM) EMPLOYING ANALOG NONVOLATILE STORAGE

(75) Inventors: Trevor A. Blyth, Sandy, UT (US); Richard V. Orlando, Los Gatos, CA (US)

(73) Assignee: Alta Analog, Inc., Campbell, CA (US)

( * ) Notice: Subject to any disclaimer, the term of this patent is extended or adjusted under 35 U.S.C. 154(b) by 32 days.

(21) Appl. No.: 10/418,538

(22) Filed: Apr. 17, 2003

Related U.S. Application Data

(60) Provisional application No. 60/374,843, filed on Apr. 23, 2002.

(51) Int. Cl.
*G11C 27/00* (2006.01)
*G11C 7/00* (2006.01)

(52) U.S. Cl. .................... 365/45; 365/189.07; 365/236

(58) Field of Classification Search ................. 365/45, 365/185.01, 236, 230.06, 189.07, 233
See application file for complete search history.

(56) References Cited

U.S. PATENT DOCUMENTS

| | | | |
|---|---|---|---|
| 4,890,259 A | | 12/1989 | Simko |
| 5,220,531 A | | 6/1993 | Blyth et al. |
| 5,235,535 A | * | 8/1993 | Nakayama ................. 708/440 |
| 6,002,614 A | * | 12/1999 | Banks .................... 365/189.01 |
| 6,038,166 A | * | 3/2000 | Wong .................... 365/185.03 |
| 6,208,542 B1 | * | 3/2001 | Wang et al. .................. 365/45 |
| 6,324,087 B1 | * | 11/2001 | Pereira ........................ 365/49 |
| 6,353,554 B1 | * | 3/2002 | Banks .................... 365/185.03 |

OTHER PUBLICATIONS

Blyth, Trevor, A non-volatile Analog Storage Device Using EEPROM Technology 1991 IEEE International Solid State Circuits Conference, Feb. 14, 1991.

* cited by examiner

*Primary Examiner*—Thong Q. Le
(74) *Attorney, Agent, or Firm*—Fernandez & Associates LLP

(57) ABSTRACT

The invention discloses an analog content addressable memory (CAM) that employs analog storage cells with programmable analog transfer function capability. The analog CAM scans and/or compares its memory array contents to determine if an analog voltage applied at Vin matches a value stored in the memory array. If the value applied to Vin matches a value stored in the analog CAM, the analog data stored at a different and corresponding location in an analog storage cell is coupled to the Vout output. An analog content addressable memory, comprising a first array A of analog memory cells for storing and generating a VA voltage; and a comparator having a first input for receiving a Vin voltage, a second input for receiving the VA voltage from the first array A of analog memory cells. Analog-to-Digital and Digital-to-Analog Converters comprising an array of analog memory cells.

47 Claims, 6 Drawing Sheets

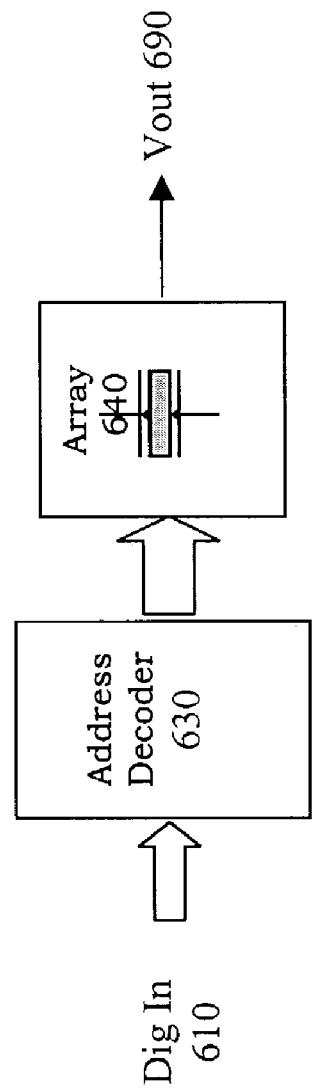

ANALOG CONTENT ADDRESSABLE MEMORY (CAM) EMPLOYING ANALOG NONVOLATILE STORAGE

CROSS REFERENCE TO RELATED APPLICATION

This application claims priority from U.S. Provisional Application Ser. No. 60/374,843, filed on Apr. 23, 2002.

BACKGROUND INFORMATION

1. Field of the Invention

The invention relates generally to the field of electronic circuits, and more particularly to analog nonvolatile storage.

2. Description of Related Art

Analog storage devices provide an attractive alternative to storing electronic information in analog form rather than in digital form. The use of electrically erasable programmable read only memory (EEPROM) cells in an analog storage device avoid the necessity to convert an analog waveform to digital representation, reducing the complexity embodied in an integrated circuit as well as decreasing the die dimension. For additional background information on analog storage for voice recording and playback in EEPROM, the reader is referred to "A Non-Volatile Analog Storage Device Using EEPROM Technology", by Trevor Blyth et al., ISSCC91/Session 11/Emerging Circuit Technologies/Paper TP 11.7, 1991, page 192.

Applications of an analog storage device have evolved from simple telephone message recordings to the recent development of compensation for the temperature characteristics of laser diodes in CD-ROM burners and high-speed optical communication systems. The latter segments of technologies often require the design of a circuit that compensates for temperature variations. For example, the bias currents and modulation currents required to maintain constant output levels from a laser diode in an optical transmitter vary with temperature.

Accordingly, it is desirable to design a system that employs a programmable analog transfer function capability for compensating variations, such as temperature fluctuations, in the system.

SUMMARY OF THE INVENTION

The invention discloses an analog content addressable memory (CAM) that employs analog storage cells with programmable analog storage capability. The analog CAM scans and/or compares the contents of a first memory array to determine if an analog voltage applied at Vin is contained in the memory array. If the value applied to Vin matches a value stored in the first array, the analog data stored at a different and matching location in an analog storage cell of a second array is coupled to the Vout output. The voltages stored in each location of both memory arrays are independently programmable, thus creating a programmable voltage transfer function between input, Vin, and output, Vout.

An analog content addressable memory, comprising a first array A of analog memory cells for storing and generating a VA voltage; and a comparator having a first input for receiving a Vin voltage, and a second input for receiving the VA voltage from the first array A of analog memory cells.

The present invention advantageously provides analog storages in a content addressable memory for storing analog voltages with a reduced number of storage cells compared to a digital memory and without the need for analog-to-digital or digital-to-analog conversion.

Other structures and methods are disclosed in the detailed description below. This summary does not purport to define the invention. The invention is defined by the claims.

BRIEF DESCRIPTION OF THE DRAWINGS

FIG. 6 is an architectural diagram illustrating a digital-to-analog converter in accordance with the present invention.

DETAILED DESCRIPTION OF PREFERRED EMBODIMENTS

Figure 1:
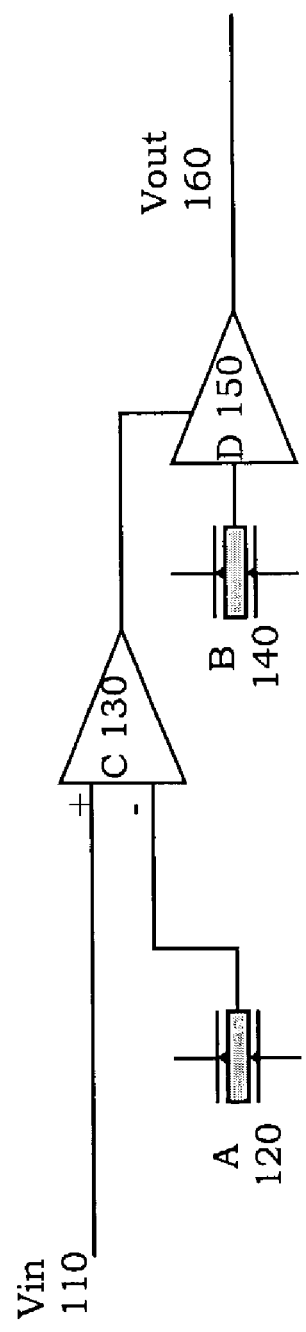
FIG. 1 is a circuit diagram illustrating a first embodiment of an analog content addressable memory in a cell structure in accordance with the present invention.

FIG. 1 is a circuit diagram illustrating a first embodiment of an analog content addressable memory (CAM) constructed with a number (n) of CAM cells. Each CAM cell 100 comprises of two programmable analog floating gate memory cells A 120 and B 140, a comparator C 130 and a transfer device D 150 such as a pass gate, having a Vin input 110 and a Vout output 160. The transfer device D 150 may be implemented as a transmission gate or an analog buffer with an enable input.

The analog floating gate memory cell A 120 is used to store the comparison value to be compared to an input Vin 110 by the comparator C 130. When the input voltage is sufficiently close to the value programmed on the floating gate A 120, a match has occurred. In this instance, the transfer device D 150 is turned ON and the content stored on the analog floating gate B 140 appears on the output of the device at Vout 160. The transfer device D 140 is designed such that if it is not enabled, the transfer device D 140 remains in a high impedance state.

Figure 2:
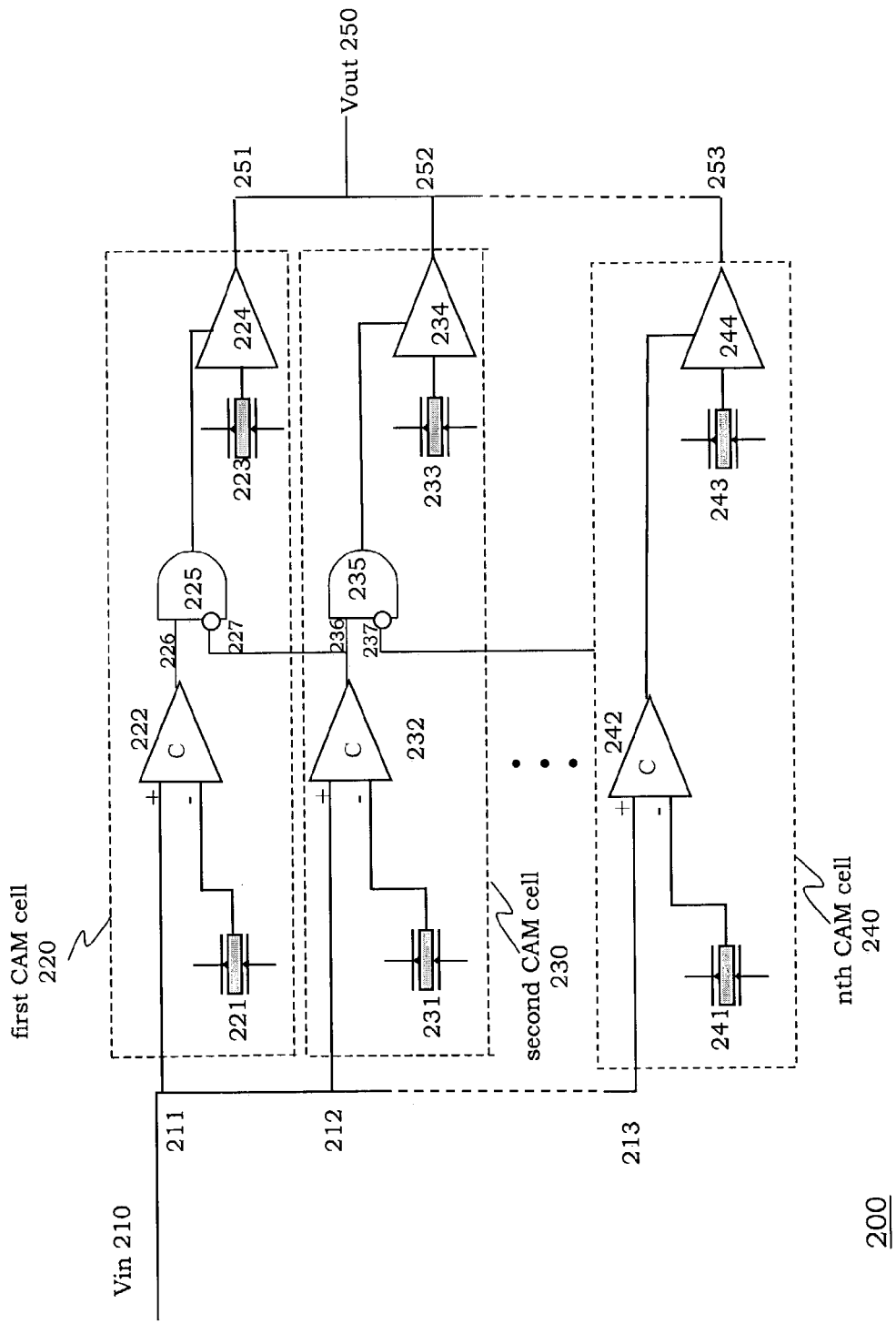
FIG. 2 is a block diagram illustrating an n-deep CAM architecture with expanded cell structures in the first embodiment in accordance with the present invention.

FIG. 2 is a block diagram illustrating an n-deep CAM architecture 200 with expanded cell structures in the first embodiment. The n-deep CAM architecture 200 comprises any number of CAM cells(n) 220, 230, and 240 that are connected together in the following manner: all Vin inputs 211, 212, and 213 are connected in parallel to Vin 210, and all Vout Outputs 251, 252, and 253 are connected in parallel to Vout 250. When a voltage is applied to the global Vin 210, the resulting data at the cell containing the value equal to Vin is generated to the output on the global Vout output 250.

When a voltage is applied to the global Vin 210, all comparators 222, 232, and 242 which have a stored input less than Vin 210 will output a high, logic "1", level. The CAM cells 220, 230, and 240 which have a stored value greater than Vin 210 will have a comparator output at logic "0". For a transmission device 224, such as a pass gate, to be selected, the input to the non-inverting input 226 of the AND gate 225 must be a logic "1" and the inverting input 227 must be at logic "0". Similarly, for a transmission device 234 to be selected, the input to the non-inverting input 236 of the AND gate 235 must be a logic "1" and the inverting input 237 must be at logic "0". Thus the CAM cell with stored value which is closest to Vin 210 will have the output transmission device enabled and its stored value in cell B 230 will appear at Vout 250. The stored voltages in cells A 220 are typically monotonically increasing.

Figure 3:
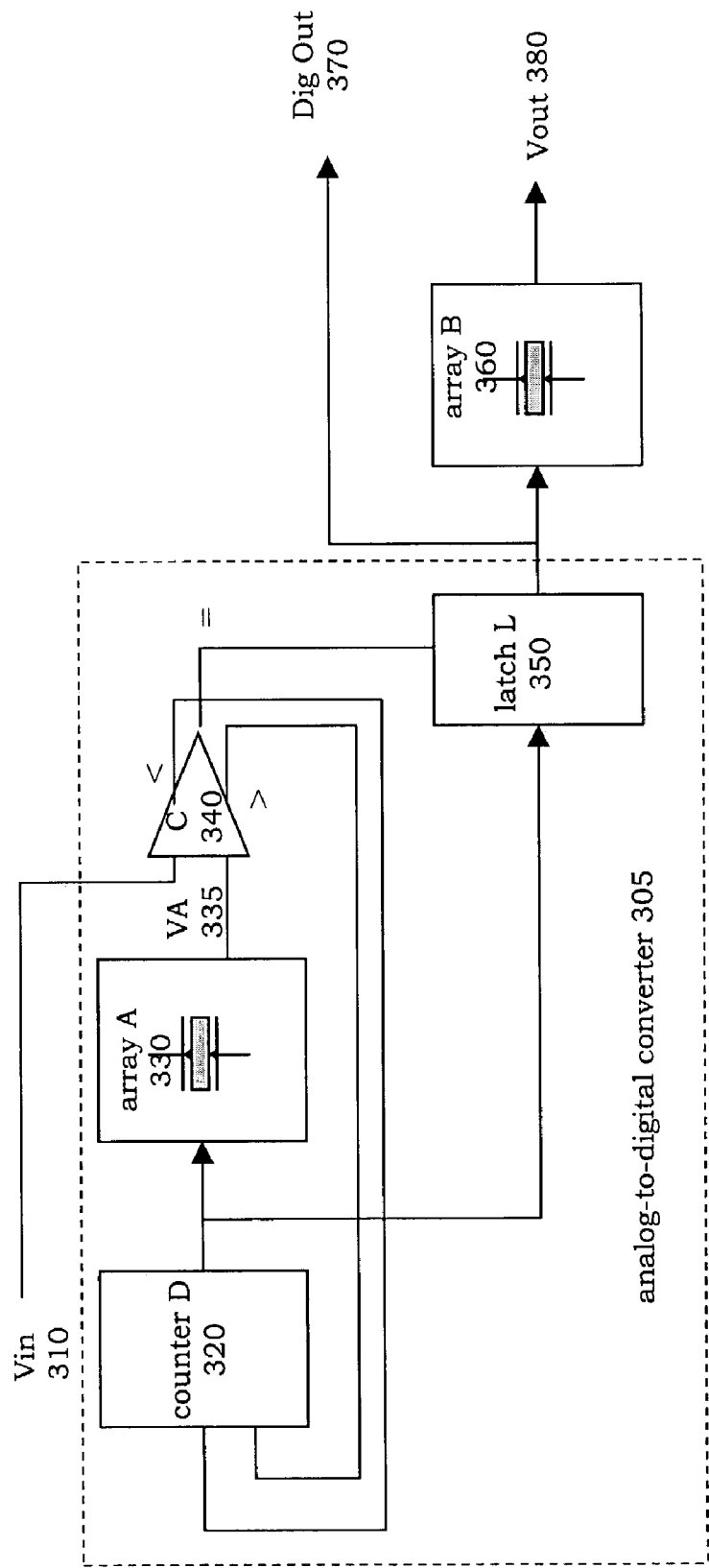
FIG. 3 is an architectural diagram illustrating a second embodiment of an analog content addressable memory employing two arrays of analog memory cells in accordance with the present invention.

FIG. 3 is an architectural diagram illustrating a second embodiment of an analog content addressable memory 300 employing two arrays of analog memory cells. The analog CAM 300 comprises of two arrays A 330 and B 360 of analog memory cells. The output of a counter D 320 selects a memory cell in the array A 330. The analog voltage VA 335 stored in the selected cell is compared with the input voltage Vin 310 at a comparator C 340. If the voltages are equal, the counter value is latched in latch L 350; if Vin 310 is less than the VA 335, the counter D 320 is incremented and if Vin 310 is greater than VA 335, the counter is decremented. The latch output selects a memory cell in array B. The output of array B is buffered and connected to Vout 380.

One of ordinary skill in the art should recognize that various modifications and variations are within the spirits in the present invention. For instance, the counter D 320 continually scans the memory array A 330. When a comparison with Vin occurs, the address for array is B latched and the corresponding output voltage Vout is obtained.

Figure 4:
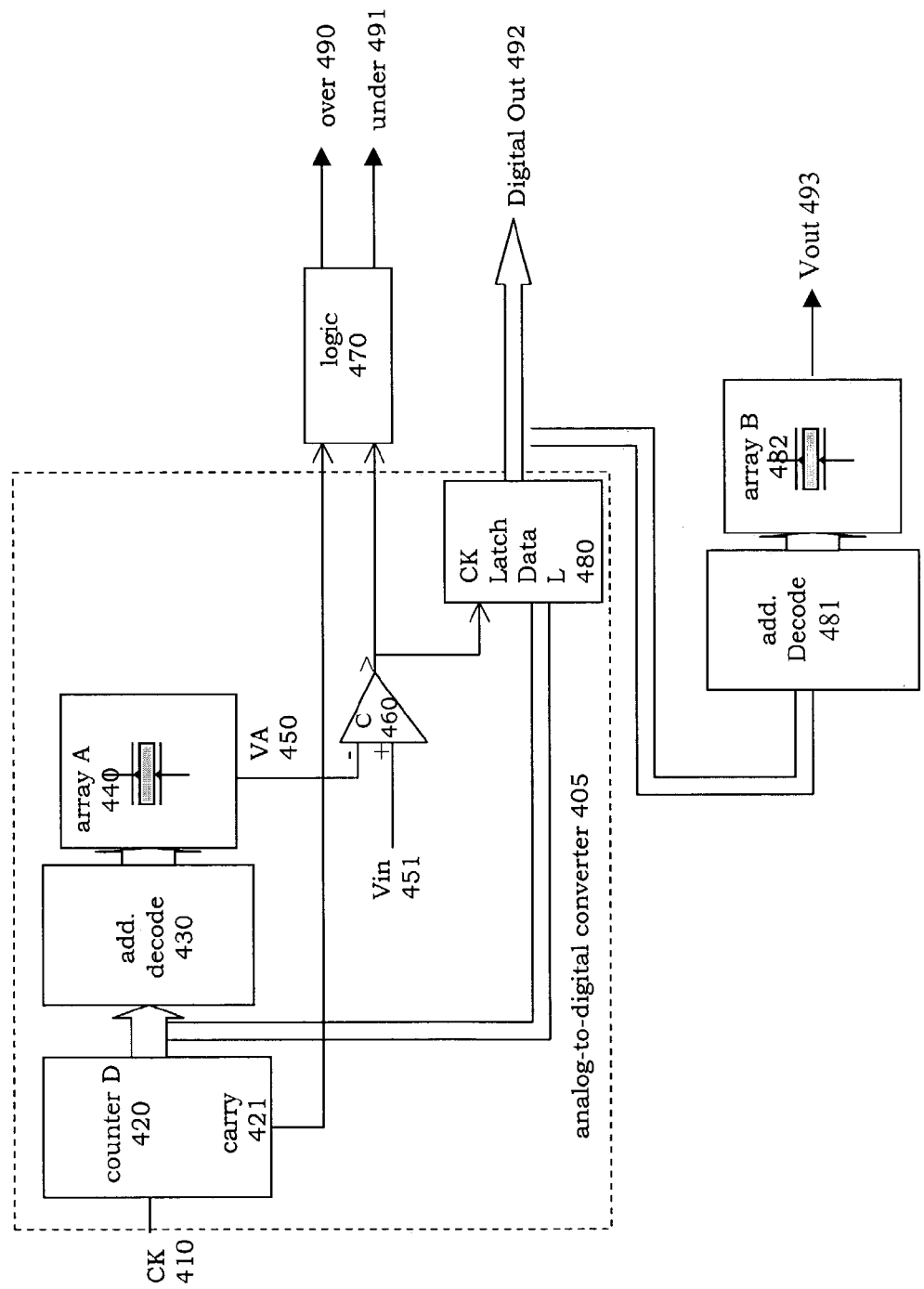
FIG. 4 is an architectural diagram illustrating a third embodiment of an analog content addressable memory employing two arrays of analog memory cells in accordance with the present invention.

FIG. 4 is an architectural diagram illustrating a third embodiment of an analog content addressable memory 400 employing two arrays of analog memory cells. The analog CAM 400 comprises of two arrays of analog memory cells in array A 440 and array B 482. The comparator in this implementation, however, is a comparator 460 that asserts its output when the input voltage Vin 451 is greater than the output, VA 450, of array A 440.

The counter D 420 is clocked continuously such that its output constantly cycles from minimum count to maximum count or from maximum count to minimum count. The output of an address decoder 430 therefore scans the contents of array A 440 and repeats. Each successive memory location in array A 440 holds analog voltages that increase monotonically.

The output, VA 450, of array A 440 is compared with the input voltage, Vin 451, and the output of the comparator changes state when Vin 451 equals VA 450, thereby latching the address at which a compare occurred into latch L 480. The latched address is output as a digital value 492 and also connected to the address input of array B 482 through an address decoder 481. The selected memory cell in array B 482 outputs its stored voltage to the Vout pin 493, possibly through a voltage buffer.

The function of the device described in FIG. 4 is to provide a completely programmable voltage transfer function between Vin 451 and Vout 493. Each analog memory array is independently programmable such that any output voltage (within the dynamic range of the device) can be output for each corresponding input voltage. In other words, the voltages stored in each location of both memory arrays are independently programmable, thus creating a programmable voltage transfer function between input, Vin, and output, Vout. This feature of programming the voltages stored in each location of both memory arrays independently provides the options to program the memory arrays by a manufacturer or an end user. The flexibility to program in-situ or at end of the field programming is beneficial, or even necessary, in technologies such as optical transmission equipment. In an optical transmission system, each laser diode possesses specific characteristics on a unit-by-unit basis that may require programming the memory arrays after final assembly of a finished unit. Therefore, the appropriate time to program the memory arrays is when transducers and laser diodes are connected to a chip.

Figure 5:
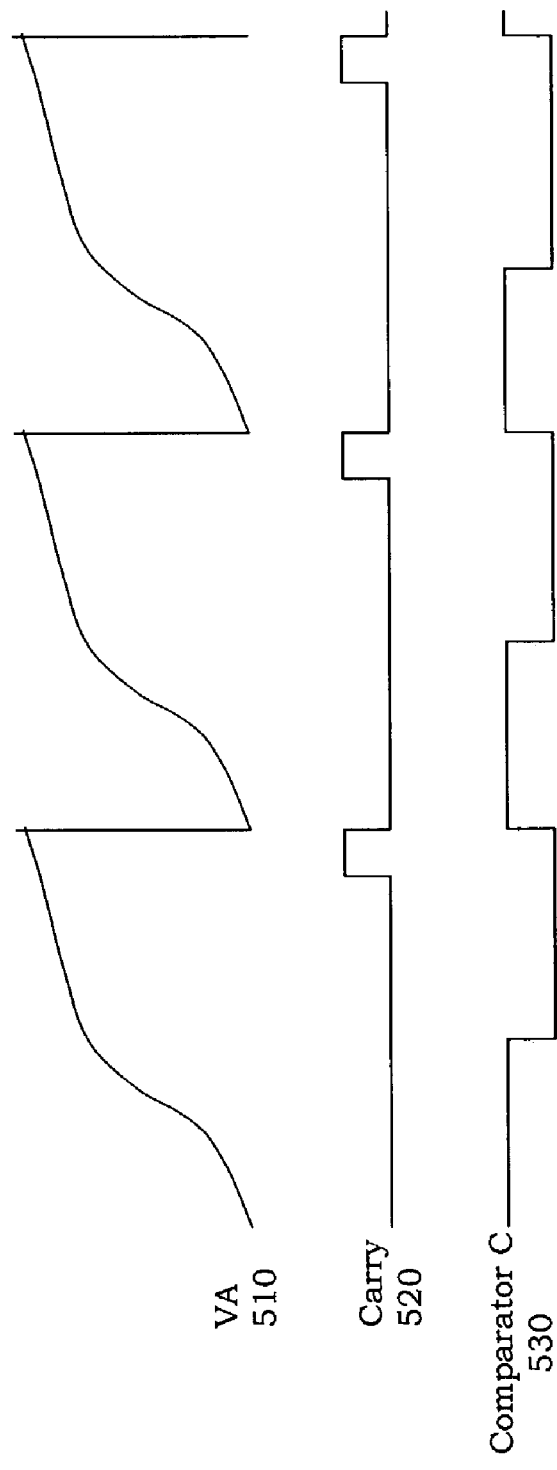
FIG. 5 is a waveform diagram illustrating the corresponding graphical representations of the comparator in the third embodiment in accordance with the present invention.

FIG. 5 is a waveform diagram 500 illustrating the corresponding graphical representations of the comparator 460 in the third embodiment. The waveform diagram 500 corresponds to a value of Vin 451 which lies within the range of voltages stored in the input array A 440. Should Vin 451 be outside the range of stored voltages then the output of comparator C 460 would be a DC level, either high or low depending on whether Vin 451 is below or above the range. The logic block 470 examines the carry output 421 of the counter 420 and the output of the comparator C 460 and asserts either the "over" output 490 or "under" output 491 if the voltage on Vin 451 is out of range.

The first, second and third embodiments have several advantages relative to each other. For instance, the first embodiment compares output voltages from analog storage cells 221, 231 and 241 in parallel, whereas the second and third embodiments compare the contents of array A 330 and 440 in series. Thus, for a given set of process electrical parameters and sub-circuit characteristics, the first embodiment has a faster response to changing input signals Vin 210 compared to the second and third embodiments. However the die surface area and power consumption of the first embodiment would be greater than embodiments two and three. It is possible to combine some of the characteristics of all three embodiments to create a hybrid approach. For example, instead of using a single comparator C 340 or 360 in the second and third embodiments respectively, multiple comparators can be used while still retaining the general architecture of counters, address decoders and dual analog storage arrays. In this case, the multiple comparators are implemented according to the first embodiment and compare adjacent locations of array A 330 or 440 with Vin 310 or 451. The multiple-bit digital word output from the comparators is used in combination with the output of counter D 320 or 420 to input a digital value into latch L 350 or 480. This hybrid approach improves the response time to a changing input signal Vin 310 or 451 but does not necessarily increase die area or power consumption to the same extent as the first embodiment.

The second and third embodiments, as shown in FIGS. 3 and 4 respectively, have digital outputs Dig Out 370 and 492. It is evident to one of ordinary skill in the art that digital outputs 370 and 492 provide a digital representation of the input signal Vin 310 or 451. Various types of analog-to-digital conversion in an analog to digital converter (ADC) 305 or ADC 405 can be performed, depending on the programmed contents of analog memory array A 330 or 430. For example, if the voltages stored in consecutive address locations of array A 330 or 430 are of equally spaced increments, then the analog-to-digital conversion performed between Vin 310 or 451 and Dig Out 370 or 492 is a linear conversion, similar to standard ADCs, as are well known in the art. Alternatively, the stored contents of memory array A 330 or 430 can have a non-linear relationship with the digital address. For example, the stored analog voltages may be programmed to $\mu$-law levels or other non-linear functions. Thus the invention described in the exemplary second and third embodiments can also be used to implement A-to-D converters with a programmable relationship between the analog input and digital output.

FIG. 6 shows an implementation of a digital-to-analog converter (DAC) 600 using an array of analog memory cells 640. A digital input signal Dig In 610 is connected to the input of Address Decoder 630. The output of 630 selects a location in array 640 and the stored analog voltage at the corresponding location is output at Vout 690. Similar to the ADCs described in the previous paragraph, the DAC may perform linear or non-linear conversions depending on the actual values stored in the memory locations of array 640. For example, if the voltage differences between consecutive address locations are equally spaced then the digital to analog conversion is linear and if the voltage differences are non-linear then various non-linear functions (such as a $\mu$-law) can be implemented. The DAC structure 600 exists twice in FIG. 3 and twice in FIG. 4. In FIG. 3, the array A 330 receives its input from the counter D 320. If the counter input is replaced with a separate digital input, such as from separate input pins to the device, then the output VA 335 from the array A 330 can represent the analog conversion of the digital input. Similarly if the input to the array B 360 is connected to a separate digital input instead of to the Dig Out 370 signal from latch L 350, then output Vout 380 can represent the analog conversion of that separate digital input. In a similar fashion, in FIG. 4, the array A 440 and/or array B 482 can be used to implement digital-to-analog converters.

The above embodiments are only illustrative of the principles of this invention and are not intended to limit the invention to the particular embodiments described. For example, an array of analog memory cells comprises any types of non-volatile memories, such as floating gate cells (e.g. EEPROM or Flash) or cells which store voltages in trap sites (e.g. MNOS or MONOS). Furthermore, the analog CAM may be implemented by using voltages that are stored without the use of non-volatile memory cells such as impedance dividers implemented with resistors or capacitors. It is apparent of one of ordinary skill in the art that the counter 420 can count up or count down which will wrap around once the counter 420 reaches the end of the count. Accordingly, various modifications, adaptations, and combinations of various features of the described embodiments can be practiced without departing from the scope of the invention as set forth in the appended claims.

We claim:

1. An analog content addressable memory (CAM), comprising:
    a first programmable analog floating gate memory cell for storing and generating a VA signal; and
    a comparator having a first input for receiving a variable Vin input signal, a second input for receiving the VA signal from the first programmable analog floating gate memory cell.

2. An analog content addressable memory (CAM), comprising:
    a first array A of analog memory cells for storing and generating a VA signal;
    a comparator having a first input for receiving a Vin input signal, a second input for receiving the VA signal from the first array A of analog memory cells, further comprising a counter having an input for receiving a clock signal and an output coupled to the first array of analog memory cells, the counter having a maximum count value a minimum count value, the counter continuously to decrement from the maximum count value to the minimum count value, each memory location in the first array A of analog memory cells increasing an analog voltage monotonically responsive to the decrement in the counter.

3. An analog content addressable memory (CAM), comprising:
    a first array A of analog memory cells for storing and generating a VA signal;
    a comparator having a first input for receiving a Vin input signal, a second input for receiving the VA signal from the first array A of analog memory cells, further comprising a counter having an input for receiving a clock signal and an output coupled to the first array of analog memory cells, the counter having a maximum count value a minimum count value, the counter continuously to increment from the minimum count value to the maximum count value, each memory location in the first array A of analog memory cells increasing an analog voltage monotonically responsive to the decrement in the counter.

4. An analog content addressable memory (CAM), comprising:
    a first array A of analog memory cells for storing and generating a VA signal;
    a comparator having a first input for receiving a Vin input signal, a second input for receiving the VA signal from the first array A of analog memory cells,
    a counter having an input for receiving a clock signal and an output coupled to the first array of analog memory cells, the counter having a maximum count value a minimum count value, the counter continuously to decrement from the maximum count value to the minimum count value, or to increment from the minimum count value to the maximum count value, each memory location in the first array A of analog memory cells increasing an analog voltage monotonically responsive to the decrement in the counter, further comprising a first address decoder coupled between the counter and the first array A of analog memory cells.

5. An analog content addressable memory (CAM), comprising:
    a first array A of analog memory cells for storing and generating a VA signal; and
    a comparator having a first input for receiving a Vin input signal,
    a second input for receiving the VA signal from the first array A of analog memory cells,
    a counter having an input for receiving a clock signal and an output coupled to the first array of analog memory cells, the counter having a maximum count value a minimum count value, the counter continuously to decrement from the maximum count value to the minimum count value, or to increment from the minimum count value to the maximum count value, each memory location in the first array A of analog memory cells increasing an analog voltage monotonically responsive to the decrement in the counter;
    a first address decoder coupled between the counter and the first array A of analog memory cells, further comprising:
        an analog-to-digital converter, comprising:
        the first array A of analog memory cells;
        the comparator;
        the counter, and
        a latch having a first input coupled to an output of the comparator, a second input coupled to the output of the counter, and an output; wherein the comparator receives the Vin input signal comprises an analog signal, and the latch generating a digital output.

6. An analog content addressable memory (CAM), comprising:
    a first array A of analog memory cells for storing and generating a VA signal; and
    a comparator having a first input for receiving a Vin input signal, a second input for receiving the VA signal from the first array A of analog memory cells, a counter having an input for receiving a clock signal and an output coupled to the first array of analog memory cells, the counter having a maximum count value a minimum count value, the counter continuously to decrement from the maximum count value to the minimum count value, or to increment from the minimum count value to the maximum count value, each memory location in the first array A of analog memory cells increasing an analog voltage monotonically responsive to the decrement in the counter;

a first address decoder coupled between the counter and the first array A of analog memory cells, further comprising:

a latch having a first input coupled to an output of the comparator, a second input coupled to the output of the counter, and an output; and a second array B of analog memory cells having an input coupled to the output of the latch.

7. An analog content addressable memory (CAM), comprising:

a first array A of analog memory cells for storing and generating a VA signal; and a comparator having a first input for receiving a Vin input signal, a second input for receiving the VA signal from the first array A of analog memory cells, a counter having an input for receiving a clock signal and an output coupled to the first array of analog memory cells, the counter having a maximum count value a minimum count value, the counter continuously to decrement from the maximum count value to the minimum count value, or to increment from the minimum count value to the maximum count value, each memory location in the first array A of analog memory cells increasing an analog voltage monotonically responsive to the decrement in the counter;

a first address decoder coupled between the counter and the first array A of analog memory cells, further comprising a second address decoder coupled between the latch and the second array A of analog memory cells.

8. An analog content addressable memory (CAM), comprising:

a first array A of analog memory cells for storing and generating a VA signal; and a comparator having a first input for receiving a Vin signal, a second input for receiving the VA signal from the first array A of analog memory cells;

and a counter having a first input for incrementing the counter contents and a second input for decrementing the counter contents.

9. The analog CAM of claim 8, further comprising a counter having a first input connected to the first output of the comparator, a second input connected to the second output of the comparator, and an output, the counter incrementing by one if the Vin signal is less than the VA signal, the counter decrementing by one if the Vin signal is greater than the VA signal.

10. An analog content addressable memory (CAM), comprising:

a first array A of analog memory cells for storing and generating a VA signal; and a comparator having a first input for receiving a Vin signal, a second input for receiving the VA signal from the first array A of analog memory cells;

and a counter having a first input for incrementing the counter contents and a second input for decrementing the counter contents; further comprising a counter having a first input connected to the first output of the comparator, a second input connected to the second output of the comparator, and an output, the counter incrementing by one if the Vin signal is less than the VA signal, the counter decrementing by one if the Vin signal is greater than the VA signal;

wherein the comparator having a first output, a second output, and a third output, the counter generating a first comparator output signal to the first output of the comparator if the Vin signal is less the VA signal, the counter generating a second comparator output signal to the second output of the comparator if the Vin signal matches the VA signal, and the counter generating a third comparator output signal to the third output of the comparator if the Vin signal greater less the VA signal.

11. An analog content addressable memory (CAM), comprising:

a first array A of analog memory cells for storing and generating a VA signal; and a comparator having a first input for receiving a Vin signal, a second input for receiving the VA signal from the first array A of analog memory cells;

and a counter having a first input for incrementing the counter contents and a second input for decrementing the counter contents; further comprising a counter having a first input connected to the first output of the comparator, a second input connected to the second output of the comparator, and an output, the counter incrementing by one if the Vin signal is less than the VA signal, the counter decrementing by one if the Vin signal is greater than the VA signal; wherein the comparator having a first output, a second output, and a third output, the counter generating a first comparator output signal to the first output of the comparator if the Vin signal is less the VA signal, the counter generating a second comparator output signal to the second output of the comparator if the Vin signal matches the VA signal, and the counter generating a third comparator output signal to the third output of the comparator if the Vin signal greater less the VA signal;

further comprising:

an analog-to-digital converter, comprising:

the first array A of analog memory cells;

the comparator;

the counter, and a latch having a first input coupled to an output of the comparator, a second input coupled to the output of the counter, and an output; wherein the comparator receives the Vin input signal comprises an analog signal, and the latch generating a digital output.

12. An analog content addressable memory (CAM), comprising:

a first array A of analog memory cells for storing and generating a VA signal; and a comparator having a first input for receiving a Vin signal, a second input for receiving the VA signal from the first array A of analog memory cells;

and a counter having a first input for incrementing the counter contents and a second input for decrementing the counter contents; further comprising a counter having a first input connected to the first output of the comparator, a second input connected to the second output of the comparator, and an output, the counter incrementing by one if the Vin signal is less than the VA signal, the counter decrementing by one if the Vin signal is greater than the VA signal; wherein the comparator having a first output, a second output, and a third output, the counter generating a first comparator output signal to the first output of the comparator if the Vin signal is less the VA signal, the counter generating a second comparator output signal to the second output of the comparator if the Vin signal matches the VA signal, and the counter generating a third comparator output signal to the third output of the comparator if the Vin signal greater less the VA signal; further comprising a second array B of analog memory cells.

13. An analog content addressable memory (CAM), comprising:
   a first array A of analog memory cells for storing and generating a VA signal; and
   a comparator having a first input for receiving a Vin signal, a second input for receiving the VA signal from the first array A of analog memory cells;
   and a counter having a first input for incrementing the counter contents and a second input for decrementing the counter contents; further comprising a counter having a first input connected to the first output of the comparator, a second input connected to the second output of the comparator, and an output, the counter incrementing by one if the Vin signal is less than the VA signal, the counter decrementing by one if the Vin signal is greater than the VA signal; wherein the comparator having a first output, a second output, and a third output, the counter generating a first comparator output signal to the first output of the comparator if the Vin signal is less the VA signal, the counter generating a second comparator output signal to the second output of the comparator if the Vin signal matches the VA signal, and the counter generating a third comparator output signal to the third output of the comparator if the Vin signal greater less the VA signal;
   further comprising:
      an analog-to-digital converter, comprising:
      the first array A of analog memory cells;
      the comparator;
      the counter, and a latch having a first input coupled to an output of the comparator, a second input coupled to the output of the counter, and an output; wherein the comparator receives the Vin input signal comprises an analog signal, and the latch generating a digital output; further comprising a latch L, the latch selecting an analog cell from the second array B of analog memory cells.

14. An n-deep analog CAM architecture, comprising:
   a first analog CAM cell, comprising;
      a first programmable analog floating gate memory cell for storing a first comparison value; and
      a first comparator having a first input for receiving a Vin input signal and a second input for receiving the first comparison value from the first programmable analog floating gate memory cell, wherein the comparator generates a match output signal if the Vin input voltage is substantially close to the first comparison value from the first programmable analog floating gate memory cell;
   a second analog CAM cell, coupled to the first analog CAM cell, comprising:
      a second programmable analog floating gate memory cell for storing a second comparison value; and
      a second comparator having a first input for receiving the Vin input signal and a second input for receiving the comparison value from the second programmable analog floating gate memory cell, wherein the second comparator generates a match output signal if the Vin input voltage is substantially close to the comparison value from the second programmable analog floating gate memory cell.

15. The n-deep analog CAM architecture of claim 14, wherein the first analog CAM cell comprises a second programmable analog floating gate memory cell for storing a value.

16. The n-deep analog CAM architecture of claim 15, wherein the second analog CAM cell comprises a second programmable analog floating gate memory cell for storing a value.

17. The n-deep analog CAM architecture of claim 16, further comprising a first AND gate having a non-inverting input, an inverting input, and an output.

18. The n-deep analog CAM architecture of claim 17, further comprising a first transmission device, the first transmission device being selected when the non-inverting input of the first AND gate has a logic "1" state and the inverting input 227 of the first AND gate has a logic "0" state.

19. The n-deep analog CAM architecture of claim 18, wherein the first gate comprises an AND gate.

20. The n-deep analog CAM architecture of claim 18, wherein the first gate comprises a NOR gate.

21. The n-deep analog CAM architecture of claim 18, further comprising a second AND gate, a non-inverting input, an inverting input, and an output.

22. The n-deep analog CAM architecture of claim 21, further comprising a second transmission device, the second transmission device being selected when the non-inverting input of the first AND gate has a logic "1" state and the inverting input 227 of the first AND gate has a logic "0" state.

23. The n-deep analog CAM architecture of claim 22, wherein the first transmission device generates a Vout signal from the stored value in the second programmable analog floating gate memory cell of the first analog CAM cell if the storage value in the first programmable analog floating gate memory cell of the first analog CAM cell is closest to the Vin signal.

24. The n-deep analog CAM architecture of claim 23, wherein the second transmission device generates a Vout from the stored value in the second programmable analog floating gate memory cell of the second analog CAM cell if the storage value in the first programmable analog floating gate memory cell of the first analog CAM cell is closest to the Vin signal.

25. The n-deep analog CAM architecture of claim 24, further comprising:
   an nth analog CAM cell, coupled to the second analog CAM cell, comprising:
      an nth programmable analog floating gate memory cell for storing a nth comparison value; and
      an nth comparator having a first input for receiving the Vin input signal and a second input for receiving the comparison value from the nth programmable analog floating gate memory cell, wherein the nth comparator generates a match output signal if the Vin input voltage is substantially close to the comparison value from the nth programmable analog floating gate memory cell.

26. The n-deep analog CAM architecture of claim 14, wherein the first comparison value in the first programmable analog floating gate memory cell is independently programmable with respect to the second comparison value stored in the second programmable analog floating gate memory cell.

27. An n-deep analog CAM architecture, comprising:
a first set of one or more programmable analog floating gate memory cells for storing a set of analog voltage comparison values, each one in the first set of one or more programmable analog floating gate memory cells having an output;
one or more comparators, each comparator having a first input, a second input, and an output, the output of each programmable analog floating gate memory cell connected to a respect one of the first input of a comparator in the one or more comparators, the second input in the one or more comparators receiving a Vin input signal for comparison with a respect one of the output generated from the set of analog voltage comparison values in the first set of one or more programmable analog floating gate memory cells;
one or more voltage transfer means, the output of each comparator in the one or more comparators connected with a respect one of a first input of the one or more transfer voltage means for enabling the one or more transfer voltage means.

28. The n-deep analog CAM architecture of claim 27, further comprising a second set of one or more programmable analog floating gate memory cells for storing a set of analog comparison values, each one in the first set of one or more programmable analog floating gate memory cells having an output, the output of each programmable analog floating gate memory cells connected to a second input of the voltage transfer means for transfer to a Vout output signal.

29. The n-deep analog CAM architecture of claim 26, wherein a programmable analog floating gate memory cell in the first set of one or more programmable analog floating gate memory cells having an analog voltage comparison value that is substantially the closest to the input voltage Vin enables a respect transfer voltage means and the contents of the corresponding analog memory cell in the second analog memory array is coupled to output Vout.

30. A cell structure in an analog content addressable memory, comprising:
a first programmable analog floating gate memory cell for storing a comparison value; and
a comparator having a first input for receiving a variable Vin input voltage and a second input for receiving the comparison value from the first programmable analog floating gate memory cell, wherein the comparator generates a match output signal if the Vin input voltage is substantially close to the comparison value from the first programmable analog floating gate memory cell.

31. The cell structure of claim 30, further comprising a second programmable analog floating gate memory cell for storing a value.

32. A cell structure in an analog content addressable memory, comprising:
a first programmable analog floating gate memory cell for storing a comparison value; and
a comparator having a first input for receiving a Vin input voltage and a second input for receiving the comparison value from the first programmable analog floating gate memory cell, wherein the comparator generates a match output signal if the Vin input voltage is substantially close to the comparison value from the first programmable analog floating gate memory cell, further comprising a second programmable analog floating gate memory cell for storing a value, further comprising a transfer device having a first input connected to the an output of the comparator, a second input connected to the second programmable analog floating gate memory cell for storing a value, and an output, the transfer device turning ON if the comparator generates a match such that the value from second programmable analog floating gate memory cell is sent to an Vout.

33. An analog-to-digital converter (ADC), comprising:
an array of analog memory cells for storing and generating a VA signal; and
a comparator having a first input for receiving an analog Vin input signal, a second input for receiving the VA signal from the first array A of analog memory cells;
a counter having an input for receiving a clock signal and an output coupled to the first array of analog memory cells, the counter having a maximum count value a minimum count value, the counter continuously to decrement from the maximum count value to the minimum count value, each memory location in the first array A of analog memory cells increasing an analog voltage monotonically responsive to the decrement in the counter; and
a latch having a first input coupled to an output of the comparator, a second input coupled to the output of the counter, and an output; wherein the latch generating a digital output signal.

34. The ADC of claim 33, wherein the ADC converts the analog Vin input signal to the digital output signal linearly if voltage differences between consecution address locations in the array of analog memory cells are equally spaced.

35. The ADC of claim 34, wherein the ADC converts the analog Vin input signal to the digital output signal nonlinearly if voltage differences between consecution address locations in the array of analog memory cells are not equally spaced.

36. An analog-to-digital converter (ADC), comprising:
an array A of analog memory cells for storing and generating a VA signal; and
a comparator having a first input for receiving an analog Vin input signal, a second input for receiving the VA signal from the first array A of analog memory cells.
a counter having a first input connected to the first output of the comparator, a second input connected to the second output of the comparator, and an output, the counter incrementing by one if the analog Vin input signal is less than the VA signal, the counter decrementing by one if the analog Vin input signal is greater than the VA signal; and
a latch having a first input coupled to an output of the comparator, a second input coupled to the output of the counter, and an output; wherein the latch generating a digital output signal.

37. The ADC of claim 36, wherein the ADC converts the analog Vin input signal to the digital output signal linearly if voltage differences between consecution address locations in the array of analog memory cells are equally spaced.

38. The ADC of claim 37, wherein the ADC converts the analog Vin input signal to the digital output signal nonlinearly if voltage differences between consecution address locations in the array of analog memory cells are not equally spaced.

39. A digital-to-analog converter (DAC), comprising:
an address decoder having an input for receiving a digital input signal and generating an output signal to an output;
an array of analog memory cells having an input coupled to the address decoder, the first array A generating an analog output signal in response to receiving the output signal from the address decoder which selects a location in the array of analog memory cells.

40. The DAC of claim 39, wherein the DAC converts the digital input signal to the analog output signal linearly if voltage differences between consecution address locations in the array of analog memory cells are equally spaced.

41. The ADC of claim 39, wherein the ADC converts the digital input signal to the analog output signal nonlinearly if voltage differences between consecution address locations in the array of analog memory cells are not equally spaced.

42. A method for employing analog nonvolatile storage, comprising:
storing a first VA signal in a first programmable analog floating gate memory cell; and
comparing the first VA signal with a Vin input signal to generate a match output signal if the Vin input signal is substantially close to the first VA value from the first programmable analog floating gate memory.

43. A method for employing analog nonvolatile storage, comprising:
storing a first VA signal in a first programmable analog floating gate memory cell; and
comparing the first VA signal with a Vin input signal to generate a match output signal if the Vin input signal is substantially close to the first VA value from the first programmable analog floating gate memory, further comprising:
incrementing a count value by one if the Vin signal is less than the first VA signal; and
decrementing a count value by one if the Vin signal is greater than the first VA signal.

44. A method for employing analog nonvolatile storage, comprising:
storing a first VA signal in a first programmable analog floating gate memory cell; and
comparing the first VA signal with a Vin input signal to generate a match output signal if the Vin input signal is substantially close to the first VA value from the first programmable analog floating gate memory, further comprising:
incrementing a count value by one if the Vin signal is less than the first VA signal; and
decrementing a count value by one if the Vin signal is greater than the first VA signal;
wherein the Vin input signal is an analog input signal.

45. A method for employing analog nonvolatile storage, comprising:
storing a first VA signal in a first programmable analog floating gate memory cell; and
comparing the first VA signal with a Vin input signal to generate a match output signal if the Vin input signal is substantially close to the first VA value from the first programmable analog floating gate memory, further comprising:
incrementing a count value by one if the Vin signal is less than the first VA signal; and
decrementing a count value by one if the Vin signal is greater than the first VA signal; wherein the Vin input signal is an analog input signal; further comprising latching an output signal from a counter to generate a digital output signal, thereby converting an analog input signal Vin to a digital output signal.

46. A method for employing analog nonvolatile storage, comprising:
storing a first VA signal in a first programmable analog floating gate memory cell; and
comparing the first VA signal with a Vin input signal to generate a match output signal if the Vin input signal is substantially close to the first VA value from the first programmable analog floating gate memory, further comprising:
storing a second VA signal in a second programmable analog floating gate memory cell; and
comparing the second VA signal with the Vin input signal to generate a match output signal if the Vin input signal is substantially close to the second VA value from the second programmable analog floating gate memory.

47. A digital-to-analog converter (DAC) method, comprising:
storing a set of analog voltages in a plurality of programmable analog floating gate memory cells;
receiving a digital input signal Vin; and
responsive to the digital input signal Vin, decoding the digital input signal Vin in generating an output address signal for selecting a programmable analog floating gate memory cell in the plurality of programmable analog floating gate memory cells thereby generating an analog output signal from the selected programmable analog floating gate memory cell.

* * * * *